(12) United States Patent
Aramaki et al.

(10) Patent No.: US 10,804,080 B2
(45) Date of Patent: Oct. 13, 2020

(54) PLASMA PROCESSING APPARATUS AND PLASMA PROCESSING METHOD

(71) Applicant: Hitachi High-Tech Corporation, Minato-ku, Tokyo (JP)

(72) Inventors: Tooru Aramaki, Tokyo (JP); Kenetsu Yokogawa, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/111,796

(22) Filed: Aug. 24, 2018

(65) Prior Publication Data

US 2019/0198297 A1 Jun. 27, 2019

(30) Foreign Application Priority Data

Dec. 21, 2017 (JP) ................. 2017-244727

(51) Int. Cl.
*H01J 37/32* (2006.01)
*H01L 21/67* (2006.01)
*H01L 21/3065* (2006.01)
*H01L 21/683* (2006.01)

(52) U.S. Cl.
CPC .. *H01J 37/32568* (2013.01); *H01J 37/32715* (2013.01); *H01L 21/3065* (2013.01); *H01L 21/67069* (2013.01); *H01J 2237/334* (2013.01); *H01L 21/6831* (2013.01)

(58) Field of Classification Search
USPC ................................................ 156/345.48
See application file for complete search history.

(56) References Cited

U.S. PATENT DOCUMENTS

| | | | | |
|---|---|---|---|---|
| 5,348,497 A | * | 9/1994 | Nitescu | H01J 37/32577 411/373 |
| 5,929,373 A | * | 7/1999 | Schiavo | H01J 37/32577 174/152 GM |
| 2010/0326957 A1 | | 12/2010 | Maeda et al. | |
| 2012/0160807 A1 | * | 6/2012 | Lam | H01J 37/18 216/67 |
| 2015/0155140 A1 | * | 6/2015 | Lee | H01J 37/3288 313/231.41 |
| 2016/0240422 A1 | * | 8/2016 | Takahashi | H01L 21/67109 |
| 2016/0351404 A1 | | 12/2016 | Aramaki et al. | |

FOREIGN PATENT DOCUMENTS

| | | |
|---|---|---|
| JP | 2011009351 A | 1/2011 |
| JP | 2016225376 A | 12/2016 |

* cited by examiner

*Primary Examiner* — Rakesh K Dhingra
(74) *Attorney, Agent, or Firm* — Miles & Stockbridge, P.C.

(57) ABSTRACT

The reliability of a plasma processing apparatus can be improved, and the yield of plasma processing can be improved. A plasma etching apparatus 100 has a susceptor ring 113 covering the surface of a sample stage, a conductor ring 131 disposed in the interior of the susceptor ring 113 and to which second high frequency electric power is supplied from a second high frequency power source, and an electric power supply connector 161 configuring a path for supplying the second high frequency electric power to the conductor ring 131. Further, the electric power supply connector 161 includes a plate spring 135 disposed in the interior of an insulating boss 144 disposed in a through hole 120c of the sample stage and having resiliency in such a manner that the plate spring 135 is connected to an upper terminal 143 and a lower terminal 145, is biased in an up-down direction P, and is expanded and contracted.

8 Claims, 8 Drawing Sheets

PLASMA PROCESSING APPARATUS AND PLASMA PROCESSING METHOD

TECHNICAL FIELD

The present invention relates to a plasma processing apparatus and a plasma processing method. More specifically, the present invention relates to a plasma processing apparatus and a plasma processing method, which are preferable for processing a material to be processed, such as a semiconductor substrate.

BACKGROUND ART

In a semiconductor manufacturing process, dry etching using plasma is typically performed. Various types of plasma processing apparatuses for performing the dry etching are used.

Typically, the plasma processing apparatus includes a vacuum processing chamber, a gas supply device connected to the vacuum processing chamber, a vacuum exhaust system maintaining the pressure in the vacuum processing chamber at a predetermined value, an electrode on which a wafer that is a material to be processed is placed, plasma generation means for generating plasma in the vacuum processing chamber, and the like. Processing gas supplied by the plasma generation means from a shower plate and the like into the vacuum processing chamber is brought into the plasma state for performing etching processing for the wafer held on the wafer placing electrode.

With the improvement in the integration degree of a semiconductor device, the microfabrication, that is, the processing precision, has been recently required to be improved, and the circuit structure of the semiconductor device has become finer, so that the semiconductor device has been required to be capable of being manufactured with good yield to have high performance to the more outer peripheral edge of a substrate, such as a semiconductor wafer, on which the circuit of the semiconductor device is formed. That is, the size of the region of the outer peripheral edge of the substrate has been required to be smaller to prevent the processing provided by the plasma processing apparatus from deteriorating the performance of the semiconductor device. To prevent such deterioration of the performance in the outer peripheral side portion of the substrate, the concentration of the electric field is reduced in the region on the outer peripheral side of the substrate on the upper face of a sample stage on which the substrate is placed. And, it is necessary to prevent the processing characteristic, for example, the processing speed (etching rate) in the case of the etching processing, in the outer peripheral side portion of the upper face of the substrate from being suddenly increased. To achieve this, it has been contemplated that to prevent the change in the thickness of a sheath formed above the upper face of the substrate, from the center to the outer peripheral edge of the substrate while the substrate is processed, the electric field in the outer peripheral side region of the substrate including a susceptor ring including a dielectric and disposed on the outer peripheral side of the substrate to cover the upper face of the upper portion of the sample stage is adjusted.

As such a technique, for example, a technique disclosed in Japanese Unexamined Patent Application Publication No. 2016-225376 (Patent Literature 1) is known. In the technique disclosed in Patent Literature 1, high frequency electric power having a predetermined frequency is applied to a conductor ring that is disposed below an insulator ring disposed in the upper portion of a sample stage on which a sample being substrate-like, such as a semiconductor wafer, is placed to surround the outer periphery of the sample, is covered by the insulator ring, and is disposed on the outer peripheral side of the sample to surround the outer peripheral side of the sample, and the entering direction of electric charge particles in the outer peripheral side portion of the upper face of the sample is perpendicularly brought close to the upper face of the sample, thereby improving the yield of the processing.

In addition, Japanese Unexamined Patent Application Publication No. 2011-009351 (Patent Literature 2) discloses a technique in which high frequency electric power for bias potential formation is supplied to a focus ring facing plasma, so that the magnitude of bias potential formed above the upper face of a conductor is adjusted according to the degree of chipping and consumption of the conductor due to the plasma, thereby preventing the performance of the processing from being varied with time.

CITATION LIST

Patent Literature

Patent Literature 1: Japanese Unexamined Patent Application Publication No. 2016-225376
Patent Literature 2: Japanese Unexamined Patent Application Publication No. 2011-009351

SUMMARY OF INVENTION

Technical Problem

The above techniques insufficiently consider the following points, and thus problems arise.

That is, Patent Literature 1 provides the function of generating series resonance on the electric power supply line for supplying the high frequency electric power to the conductive ring to lower the impedance of the electric power supply line, thereby flowing large electric current, but does not consider the point in which the heat generation amount in the electric power supply path becomes larger due to the flowing of the large electric current. In particular, Patent Literature 1 does not consider the point in which when the large electric current flows, high heat generation occurs in the connection portion of two members disposed on the electric power supply path in the interior of the sample stage and configuring the path, such as the connector of the cable, can damage the connection portion, and can affect the peripheral member.

In addition, in Patent Literature 2, when the focus ring facing the plasma comes into contact with the plasma, the electric current of the high frequency electric power from the electric power supply line to the focus ring can flow into the plasma, and in this case, the same problems as Patent Literature 1 are caused. The technique of Patent Literature 2 does not consider the point in which the heat generation becomes higher in the connection portion on the electric power supply path in the interior of the sample stage to damage the electric power supply path, thereby deteriorating the reliability of the apparatus and the point in which the temperature becomes non-uniform due to the influence of the heat generation on the upper face of the sample stage or on the upper face of the wafer placed on the upper face of the sample stage, so that the shape after the processing is significantly different from the predetermined shape.

An object of the present invention is to provide a technique that can improve the reliability of a plasma processing apparatus and improve the yield of plasma processing.

The above object and novel features of the present invention will be apparent from the description herein and the accompanying drawings.

Solution to Problem

The outline of a representative embodiment disclosed in the present invention will be briefly described as follows.

A plasma processing apparatus for processing a semiconductor wafer using plasma in a processing chamber, includes a vacuum vessel including, in the interior of the vacuum vessel, the processing chamber in which the plasma is generated, a sample stage disposed in the lower portion of the processing chamber and including a placing face on which a semiconductor wafer to be processed is placed, the sample stage being supplied first high frequency electric power from a high frequency power source while the plasma is generated, a power source configured to supply an electric field for plasma which is generated by using gas supplied into the processing chamber, a base material constituted by a conductive material and an insulating plate disposed below the base material both of which have cylindrical shapes and configure, a ring-shaped member constituted by a dielectric material and disposed above the base material in the outer periphery of the placing face of the sample stage to cover the surface of the outer periphery of the sample stage, a ring-shaped electrode which is disposed between the ring-shaped member and the base material, and to which second high frequency electric power is supplied, and an electric power supply connector being disposed in a through hole arranged inside the sample stage including at least the base material and the insulating plate below the ring-shaped electrode, and configuring a path for supplying the second high frequency electric power to the ring-shaped electrode. The electric power supply connector includes a portion disposed in the interior of a tubular insulating member, the tubular insulating member being constituted by an insulative material and disposed in the through hole, the portion extending from an upper end portion of the through hole to a lower space of a bottom surface of the sample stage through a bottom end opening of the through hole on the bottom surface of the sample stage in which the pressure is maintained in an atmospheric pressure and including a cylindrical upper end member a position of which is fixed with respect to the base material inside the tubular insulating member and a lower end member which extends from the inside space of the through hole to the lower space of the sample stage and a resilient conductor which is disposed between the upper end and lower end members and electrically connected with both and is biased in an up-down direction, and is expanded and contracted, the portion being configured to increase and decrease a length between the upper end member and the lower end member through the bottom end opening by the resilient conductor's expansion and contraction. The apparatus further includes a seal member disposed between an outer cylindrical side wall surface of the upper end member and an inner cylindrical side wall surface of the tubular insulating member and hermetically sealing between an upper region of an interior space of the insulative tubular member and a lower region of said interior space of the insulative tubular member which communicates with the lower space of the sample stage which is maintained in the atmospheric pressure.

In addition, a plasma processing method according to an embodiment has the steps of (a) placing a semiconductor wafer on a sample stage provided in a vacuum vessel in which plasma processing is performed, and (b) forming plasma above the semiconductor wafer placed on the sample stage, and while the plasma is formed, supplying first high frequency electric power from a first high frequency power source to the sample stage to perform the plasma processing on the semiconductor wafer. In addition, while the plasma is processed, second high frequency electric power is supplied from a second high frequency power source via an electric power supply connector provided in the sample stage to an electrode disposed in the upper portion of the outer periphery of the sample stage. Further, the second high frequency electric power is supplied via the electric power supply connector including a tubular member including an insulator and disposed in a through hole extending through the interior of the portion of the sample stage covered by a ring-shaped member and a conductive member disposed in the interior of the tubular member and having resiliency in such a manner that the conductive member is connected to terminals at the upper and lower ends of the conductive member, is biased in an up-down direction, and is expanded and contracted.

Advantageous Effects of Invention

The effects obtained by the representative inventions disclosed in the present invention will be briefly described as follows.

The reliability of the plasma processing apparatus can be improved, and the yield of the plasma processing can be improved.

DESCRIPTION OF EMBODIMENTS

An embodiment of the present invention will be described with reference to the drawings.

Figure 1:
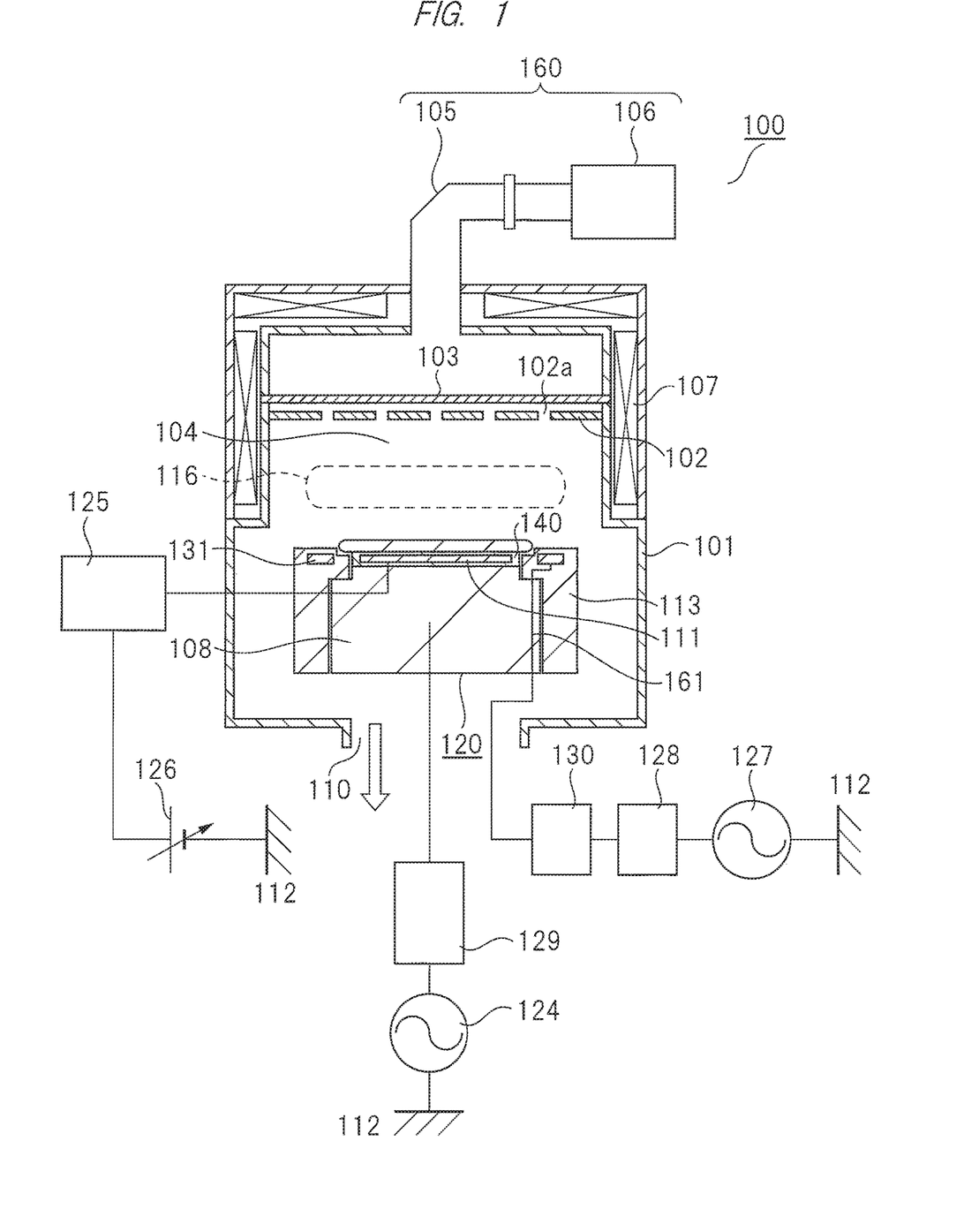
FIG. 1 is a schematic cross-sectional view illustrating the outline of the configuration of a plasma processing apparatus according to an embodiment of the present invention.

The embodiment of the present invention will be described below with reference to FIGS. 1 to 5. FIG. 1 is a schematic cross-sectional view illustrating the outline of the configuration of a plasma processing apparatus according to the embodiment of the present invention. In particular, FIG. 1 illustrates a plasma etching apparatus that uses a microwave electric field as an electric field for forming plasma to generate ECR (Electron Cyclotron Resonance) of the microwave electric field and a magnetic field to form the plasma, and uses the plasma to subject a substrate-like sample, such as a semiconductor wafer, to etching processing.

A plasma etching apparatus (plasma processing apparatus) 100 illustrated in FIG. 1 will be described. The plasma etching apparatus 100 has a vacuum vessel 101 including, in the interior of the vacuum vessel 101, a processing chamber 104 in which plasma is formed. The vacuum vessel 101 has an opened upper portion having a tubular shape, and a dielectric window 103 (for example, made of quartz) for introducing a microwave is disposed as a cover member in the upper portion, thereby forming the processing chamber 104 hermetically partitioning the inside and the outside.

In addition, a vacuum exhaust port 110 is disposed in the lower portion of the vacuum vessel 101, and communicates with a vacuum exhausting apparatus (not illustrated) disposed below and connected to the vacuum vessel 101. Further, a shower plate 102 configuring the ceiling face of the processing chamber 104 is provided below the lower face of the dielectric window 103 configuring the cover member in the upper portion of the vacuum vessel 101. The shower plate 102 has a plurality of gas admission holes 102a disposed at its center, and etching processing gas is admitted into the processing chamber 104 through the plurality of gas admission holes 102a. The shower plate 102 is for example, a disk including a dielectric, such as quartz.

In addition, an electric field and magnetic field forming section 160 forming an electric field and a magnetic field for generating plasma 116 is disposed at the location above the outside of the vacuum vessel 101. The electric field and magnetic field forming section 160 is provided in the plasma etching apparatus 100 to include the following configuration. That is, a waveguide 105 disposed above the dielectric window 103 and having an interior in which a high frequency electric field having a predetermined frequency for generating the plasma 116 is transmitted to be supplied into the processing chamber 104 is disposed in the electric field and magnetic field forming section 160. Further, the electric field transmitted in the interior of the waveguide 105 is generated and formed in an electric field generating power source 106. The frequency of the electric field is not particularly limited, but in this embodiment, a microwave at 2.45 GHz is used.

In addition, a magnetic field generating coil 107 forming the magnetic field is disposed on each of the portion upward of the dielectric window 103 for the processing chamber 104, the side wall of the vacuum vessel 101 configuring the tubular shape portion of the processing chamber 104, and the outer peripheral side of the lower end of the waveguide 105, in a state of surrounding these. And, the microwave electric field generated by the electric field generating power source 106 is propagated in the interior of the waveguide 105, is transmitted through the dielectric window 103 and the shower plate 102, and is supplied into the processing chamber 104 from above. Further, the interaction of the microwave electric field with the magnetic field generated by the magnetic field generating coil 107 and supplied into the processing chamber 104 generates ECR (Electron Cyclotron Resonance). And, the atoms or molecules of the processing gas admitted through the gas admission holes 102a of the shower plate 102 into the processing chamber 104 are excited and dissociated, thereby generating the plasma 116 having high density in the processing chamber 104.

Figure 2:
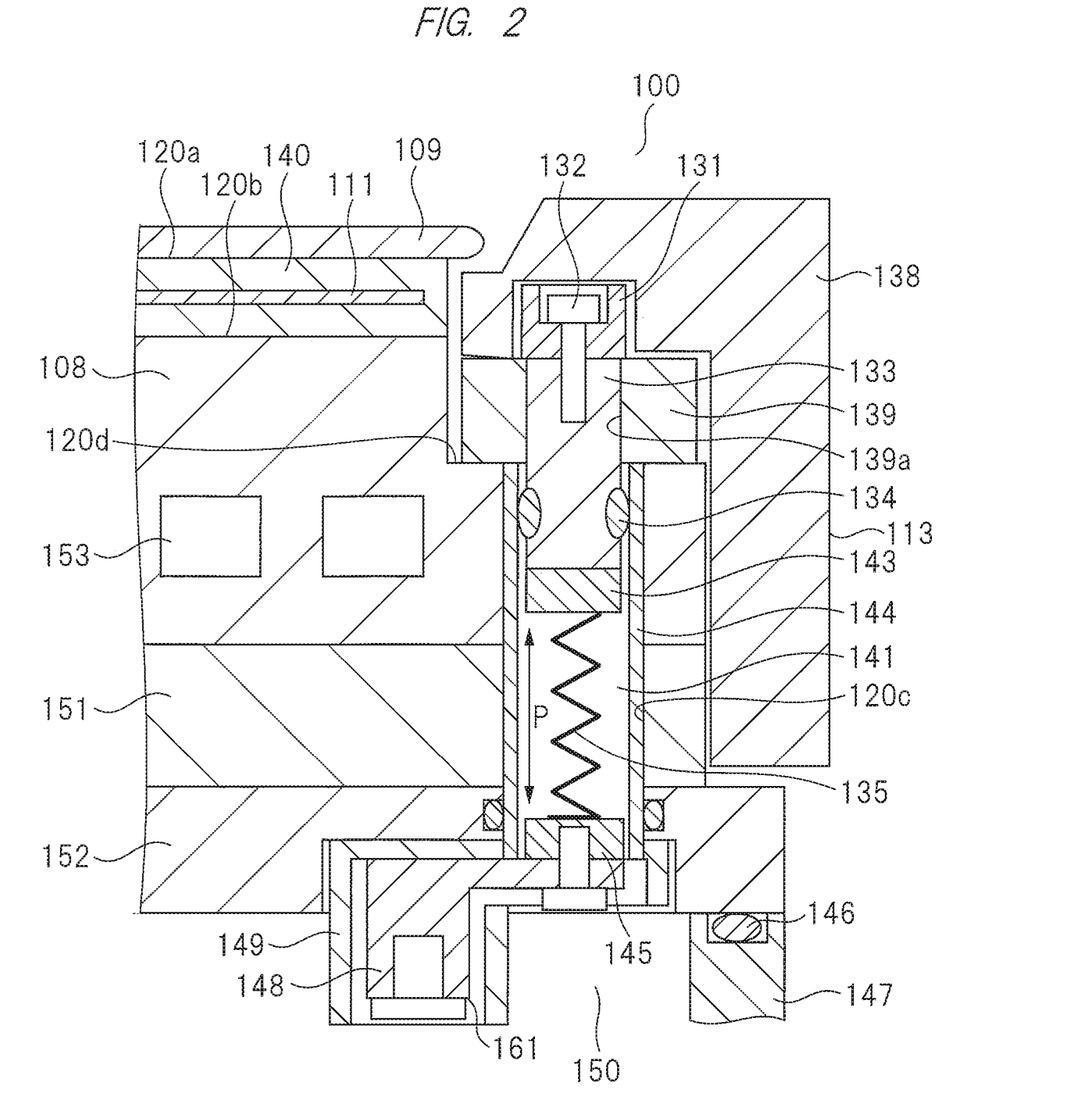
FIG. 2 is a schematic cross-sectional view illustrating, in enlarged dimension, the configuration of a susceptor ring portion of a sample stage of the plasma processing apparatus illustrated in FIG. 1.

In addition, a wafer placing electrode (first electrode) 120 configuring a sample stage is provided in the lower portion of the processing chamber 104 and below a space in which the plasma 116 is formed. It should be noted that the wafer placing electrode 120 includes a placing face 120a on which a semiconductor wafer (hereinafter, also simply called a wafer) 109 that is a sample (to be processed) is placed. And, the placing face 120a of the wafer placing electrode 120 is disposed to be opposite the shower plate 102 or the dielectric window 103. As illustrated in FIG. 2, the wafer placing electrode 120 has an upper face 120b covered by a dielectric film 140 configuring the placing face 120a. A plurality of conductor films for electrostatic suction (electrostatic suctioning electrodes) 111 connected through a high frequency filter 125 illustrated in FIG. 1 to a direct current power source 126 are disposed in the interior of the dielectric film 140. Here, the conductor films 111 configure the placing face 120a of the sample stage, and are the electrostatic suctioning electrodes being film-like and having an interior to which direct current electric power for semiconductor wafer suction by static electricity is supplied. In that case, the conductor films 111 may have a dipole in which different polarities are provided to one and the other of a plurality of film-like electrodes, or may have a monopole in which the same polarity is provided to one and the other of the plurality of film-like electrodes, and in this embodiment, the conductor films 111 are illustrated to have a monopole.

In addition, a high frequency power source (first high frequency power source) 124 and a matching device 129 are disposed at the location near the electrostatic suctioning electrodes (conductor films 111) with respect to the high frequency filter 125, and are connected to an electrode base material 108 including a conductor, having a circular or tubular shape, and disposed in the interior of the wafer placing electrode 120. It should be noted that the high frequency power source 124 is connected to a ground 112. And, high frequency electric power (first high frequency electric power) having a predetermined frequency is supplied from the high frequency power source 124 to the electrode base material 108, and while the wafer 109 is processed, bias potential is formed above the wafer 109 suctioned and held onto the upper face of the wafer placing electrode 120. In other words, the sample stage has the wafer placing electrode (first electrode) 120 to which the high frequency electric power (first high frequency electric power) is supplied from the high frequency power source 124 while the plasma 116 is formed.

It should be noted that the electrode base material 108 is provided with a temperature sensor (not illustrated) and a plurality of through holes for incorporating a plurality of lift pins for holding the wafer 109 on their ends to lift or lower the wafer 109 above the placing face 120a. Further, an upper and lower sensor (not illustrated) for detecting the positions of the lift pins, and the like are disposed. For this, when such detectors (sensors) of the wafer placing electrode 120 are under an electric noise environment, the detectors can malfunction. Further, a coolant flowing and circulating in a coolant flow furnace can also be charged with static electricity under the electric noise environment.

Accordingly, the electrode base material 108 may be connected to a ground electrode, not illustrated, to be at ground potential, another film-like electrode including a conductor may be disposed in the dielectric film 140 on the surface of the electrode base material 108, the film-like electrode may be connected through the matching circuit 129 to the high frequency power source 124 to be supplied with the high frequency electric power, and the bias potential may thus be formed above the upper face of the wafer 109 while the wafer 109 is processed. In addition, to remove the heat being transmitted to cool the wafer placing electrode 120, a coolant flow passage 153 is disposed in the interior of the electrode base material 108 in a multiply winding manner to be helical or concentric about the center axis in the up-down direction of the electrode base material 108 or the wafer placing electrode 120. The cooling coolant for cooling the electrode base material 108 flows in the coolant flow passage 153.

Further, on the outer peripheral side of the upper portion of the wafer placing electrode 120, a recess 120d disposed on the outer peripheral side of the placing face 120a to surround the upper portion of the outer peripheral side of the placing face 120a is disposed. A susceptor ring 113 that is a ring-shaped member including a dielectric of ceramics, such as quartz or alumina, is placed and disposed on the ring-shaped upper face of the recess 120d formed to be lower than the placing face 120a of the sample stage. The upper face of the susceptor ring 113 has a dimension higher than the placing face 120a of the wafer placing electrode 120 in a state where the upper face of the susceptor ring 113 is placed on the recess 120d. It should be noted that the susceptor ring 113 is disposed in the outer periphery of the placing face 120a of the wafer placing electrode (sample stage) 120, and covers the surface of the wafer placing electrode 120. Specifically, the susceptor ring 113 covers the upper face of the recess 120d, the tubular side wall face of the recess 120d, and the tubular side wall face of the wafer placing electrode (sample stage) 120 below the recess 120d.

In such a plasma etching apparatus 100, in a vacuum conveying chamber whose pressure is reduced to the same pressure as the processing chamber 104 in the interior of a vacuum conveying vessel that is another vacuum vessel coupled to the side wall of the vacuum vessel 101, the wafer 109 before the processing is placed onto the arm ends of a wafer conveying robot disposed in the vacuum conveying chamber. And, a gate that is a passage communicating the vacuum conveying chamber with the processing chamber 104 is opened by operating a valve disposed in the vacuum conveying chamber, and the wafer 109 before the processing is then conveyed into the processing chamber 104 in a state where the wafer 109 is placed on the arm ends of the robot. Further, the wafer 109 that is conveyed to above the placing face 120a of the wafer placing electrode 120 in the processing chamber 104 is transferred onto the lift pins that move in the up-down direction, is further placed on the placing face, and is suctioned and held onto the placing face 120a of the wafer placing electrode 120 by electrostatic force formed by the direct current electric power applied from the direct current power source 126.

In this state, the etching processing gas is adjusted in its flow rate or speed by a mass flow controller (not illustrated), and is admitted into the space of the gap between the dielectric window 103 and the quartz shower plate 102, is diffused in the space, and is admitted through the gas admission holes 102a of the shower plate 102 into the processing chamber 104. Thereafter, by operating the vacuum exhausting apparatus, the gas and particles in the processing chamber 104 are exhausted through the vacuum exhaust port 110. According to the balance between the supply amount of the gas from the gas admission holes 102a of the shower plate 102 and the exhaust amount from the vacuum exhaust port 110, the interior of the processing chamber 104 is adjusted to a predetermined value within the range suitable for processing the wafer 109.

In addition, while the wafer 109 is suctioned and held, the gas having heat transmissivity, such as He (helium), is supplied from the opening, not illustrated, of the upper face of the dielectric film 140, into the gap between the wafer 109 and the upper face of the dielectric film 140 that is the placing face 120a of the wafer placing electrode 120, so that the heat transmission between the wafer 109 and the wafer placing electrode 120 is promoted. It should be noted that the coolant that is adjusted to the temperature within the predetermined range flows and circulates in the coolant flow passage 153 disposed in the electrode base material 108 in the wafer placing electrode 120, so that the temperature of the wafer placing electrode 120 or the electrode base material 108 is previously adjusted before the wafer 109 is placed. Therefore, the heat is transmitted between the wafer 109 and the wafer placing electrode 120 or the electrode base material 108 having high thermal capacity, so that the temperature of the wafer 109 is adjusted to be close to the temperature of the wafer placing electrode 120 and the electrode base material 108 before the processing, and the heat from the wafer 109 is also transmitted after the start of the processing, thereby adjusting the temperature of the wafer 109.

In this state, the microwave electric field and the magnetic field are supplied into the processing chamber 104 to generate the plasma 116 by using the gas. When the plasma 116 is formed, the high frequency (RF) bias electric power is supplied from the high frequency power source 124 to the electrode base material 108, and the bias potential is formed above the upper face of the wafer 109 to attract the electric charge particles, such as ions, in the plasma 116 onto the upper face of the wafer 109 according to the potential difference between the potential of the wafer 109 and the potential of the plasma 116. Further, the electric charge particles collide with the surface of a film layer to be processed in a film structure previously disposed on the upper face of the wafer 109 and including a mask and the film layer to be processed, thereby performing the etching processing. During the etching processing, the processing gas admitted into the processing chamber 104 and the reactive product particles caused during the processing are exhausted from the vacuum exhaust port 110.

And, in the plasma etching apparatus 100 of this embodiment, while the plasma is processed, second high frequency electric power is supplied from a high frequency power source (second high frequency power source) 127 to a conductor ring (second electrode) 131 disposed in the upper portion of the outer periphery of the sample stage through a later-described electric power supply connector 161 provided in the sample stage and including a conductive member having resiliency.

In the wafer placing electrode 120 of this embodiment, the alternating high voltage generated from the high frequency power source (second high frequency power source) 127 is introduced through a matching device 128 for load and a load impedance variable box 130 into the conductor ring (second electrode) 131 including a conductor and disposed in the susceptor ring 113. By this configuration, a combination of the load impedance variable box 130 adjusted to the preferable impedance value and the relatively high impedance portion disposed in the upper portion of the susceptor ring 113 relatively lowers the impedance value with respect to the high frequency electric power from the high frequency power source 127 through the electrode base material 108 to the outer peripheral edge of the wafer 109. With this, the high frequency electric power is effectively supplied to the outer peripheral side portion and the outer peripheral edge of the wafer 109, and the concentration of the electric field in the outer peripheral side portion or the outer peripheral edge is released, so that the electric charge particles, such as ions, in the plasma can be attracted onto the upper face of the wafer 109 in the desired direction. The high frequency power source 127 is connected to the ground 112. It should be noted that the frequency of the high frequency power source 127 of this embodiment is preferably set to the same value as the high frequency power source 124 or the value obtained by multiplying the value of the high frequency power source 124 by a constant number.

Figure 3:
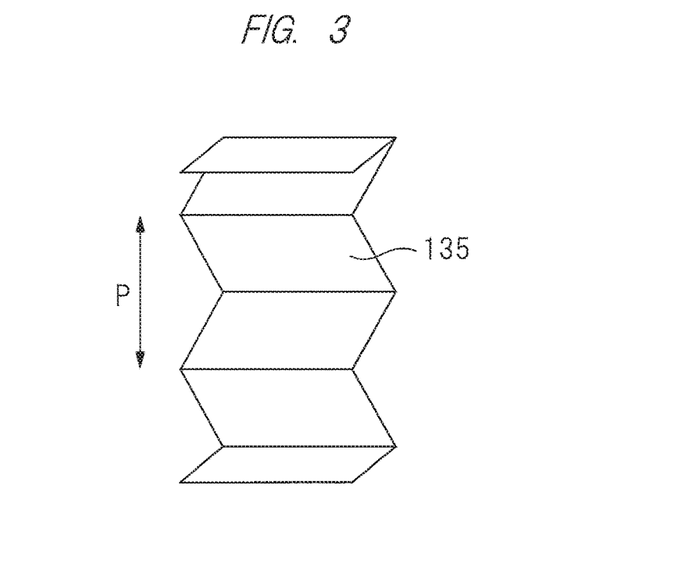
FIG. 3 is a schematic perspective view illustrating, in enlarged dimension, the configuration of a plate spring illustrated in FIG. 2.

Next, referring to FIG. 2, the detail of the configuration of the electric power supply line in the susceptor ring 113 to the conductor ring 131 of this embodiment will be described. FIG. 2 is a schematic cross-sectional view illustrating, in enlarged dimension, the configuration of a susceptor ring portion of the sample stage of the plasma processing apparatus illustrated in FIG. 1, and FIG. 3 is a schematic perspective view illustrating, in enlarged dimension, the configuration of a plate spring illustrated in FIG. 2.

The conductor ring 131 illustrated in FIG. 2 is a conductor made of metal and the like, but can be a member including a conductor having a surface on which a film having insulating properties is formed. The conductor ring 131 of this embodiment is made by coating alumite on the surface of an aluminum member as a base material by anodic oxidation treatment.

The conductor ring (second electrode) 131 is disposed in the interior of the susceptor ring 113, and further, the second high frequency electric power is supplied from the high frequency power source 127 to the conductor ring 131.

In addition, as an electric power supply path for supplying the high frequency electric power for bias formation to the conductor ring 131, the electric power supply connector 161 including a conductor, disposed below the conductor ring 131, and connected to the lower face of the conductor ring 131 is disposed. And, the electric power supply connector 161 and the conductor ring 131 are fastened by a conductive screw 132 fitted into a hole formed in the conductor ring 131 from above the conductor ring 131, and are electrically connected. The electric power supply connector 161 includes an electric power supply boss 133 including a member including a conductor, such as metal, having a tubular shape, and including a conductor, and an upper terminal (terminal at an upper end) 143 being tubular and abutted onto the lower face of the electric power supply boss 133 to be electrically connected thereto. Further, the electric power supply connector 161 includes a plate spring (spring member, conductive member) 135 having an upper end connected to the lower face of the upper terminal 143, a lower terminal (terminal at a lower end) 145 being tubular and having an upper face to which the lower end of the plate spring 135 is connected, and a relay terminal 148 including a conductor and fastened and connected to the lower face of the lower terminal 145 by a screw or a bolt. The plate spring 135 has the configuration illustrated in FIG. 3, and has resiliency in an up-down direction P. The relay terminal 148 is disposed in a guiding section 149. As described above, the electric power supply connector 161 is a connector member configuring the path for supplying the second high frequency electric power to the conductor ring 131.

In addition, the wafer placing electrode 120 has the electrode base material 108 configuring its upper portion. The electrode base material 108 includes the coolant flow passage 153 having a tubular or disk shape and in which the coolant flows in its inside. And, the wafer placing electrode 120 includes the electrode base material 108, an insulating plate 151 being disk shaped and disposed below the lower face of the electrode base material 108 to be connected to the electrode base material 108, and a ground plate 152 being a disk-shaped member including a conductor, disposed below the lower face of the insulating plate 151 to be abutted on the insulating plate 151, and made to be at the ground potential. Further, in the wafer placing electrode 120, the electrode base material 108, the insulating plate 151, and the ground plate 152 are fastened by a bolt, not illustrated, to be integrally coupled.

In addition, the lower face of the outer peripheral end of the ground plate 152 and an electrode base 147 having a tubular shape and having an upper end face on which the lower face of the outer peripheral end of the ground plate 152 is placed, are fastened across a seal member 146, such as an O-ring, between these by a bolt, not illustrated. In detail, the lower face of the outer peripheral end of the ground plate 152 and the electrode base 147 are fastened so that a space 150 below the ground plate 152 and on the center side from the electrode base 147 and the processing chamber 104 outside the wafer placing electrode 120 are hermetically sealed.

In this embodiment, the electric power supply connector 161 is disposed to be fitted into the interior of a through hole 120c extending through the electrode base material 108 and the insulating plate 151 and the ground plate 152 therebelow and a through hole 139a formed in an insulating ring 139 including an insulator or a dielectric and being ring shaped. The through hole 120c is a hole opened to the upper face of the recess 120d disposed in a ring shape on the outer peripheral side of the tubular protrusion at the center on which the wafer 109 is placed, in the upper portion of the electrode base material 108. In addition, the through hole 139a is a hole formed in the insulating ring 139 including an insulator or a dielectric, being ring shaped, and configuring the susceptor ring 113 placed on the recess 120d.

And, in the inside of the through hole 120c extending through the electrode base material 108 and the insulating plate 151 and the ground plate 152 therebelow, the wall face of the outer periphery of an insulating boss (tubular member) 144 made of an insulative material and being tubular is abutted on and fitted to the peripheral wall face of the through hole 120c. In addition, the electric power supply boss 133 and the upper terminal 143, the plate spring 135, and the lower terminal 145 therebelow are inserted and accommodated in a space 141 inside the insulating boss 144, and are insulated with respect to the electrode base material 108 and the ground plate 152 outside the insulating boss 144. Further, an O-ring 134 is disposed between the side wall of the outer periphery of the electric power supply boss 133 and the inner peripheral side wall of the insulating boss 144 to be interposed between these and sealing the space 141 below the electric power supply boss 133 with respect to the space thereabove.

It should be noted that in this embodiment, the O-ring 134 that is a seal portion hermetically seals the space 141 with respect to the space above the insulating boss 144 or the through hole 120*c* communicated with the processing chamber 104. This can reliably ensure the electric connection between the upper terminal 143, the metal plate spring 135, the lower terminal 145, and the relay terminal 148 that come into contact with each other in the space 141 communicated with the space 150 to be maintained at the same atmospheric pressure or a pressure close to the extent of being assumed to this. Further, it is possible to prevent the deterioration of the performance of the electric connection due to corrosion caused by the particles having high reactivity in the processing chamber 104, which enter the location where the upper terminal 143, the metal plate spring 135, the lower terminal 145, and the relay terminal 148 come into contact with each other, or reactive product generation, or member degradation.

In addition, cooling is promoted so that the processing result in the outer periphery of the wafer 109 by the increase in the temperature of the susceptor ring 113 due to the promotion of the transmission of the heat from the conductor ring 131 heated by the supplied high frequency electric power can be prevented from being outside the allowable range from the predetermined range. That is, in the electric power supply connector 161 of this embodiment, as the path for the electric power supply between the terminals including conductors, the plate spring 135 expanded and contracted in the dimension in the length direction according to received outer force is used. That is, the electric power supply connector 161 provided in the plasma etching apparatus 100 of this embodiment includes the plate spring 135 disposed in the interior of the insulating boss 144 including an insulator and disposed in the through hole 120*c* extending through the interior of the portion of the sample stage (wafer placing electrode 120) covered by the susceptor ring 113 and having resiliency in such a manner that the plate spring 135 is connected to the upper terminal 143 and the lower terminal 145, is biased in the up-down direction, and is expanded and contracted. The up-down direction is the direction indicated by a double-headed arrow P in FIG. 2.

Further, in the plasma etching apparatus 100, the plate spring 135, the upper terminal 143, and the lower terminal 145 are disposed in the space 141 made to be at the atmospheric pressure. And, by the seal member, such as the O-ring 134, the plate spring 135, the upper terminal 143, and the lower terminal 145 are hermetically sealed at the position between the space 141 made to be at the atmospheric pressure and the processing chamber 104 and at the location in the interior of the through hole 120*c* above the upper terminal 143.

Here, the problems of the present invention studied by the present inventors will be described.

For example, in the plasma processing apparatus compared and studied by the present inventors, the wafer placing electrode 120 is heated in receipt of the heat from the plasma 116 formed in the processing chamber 104 while the wafer 109 is processed and the heat generated by the interaction related to the processing on the surface of the wafer 109. In this case, the difference in shape is caused by the difference in the thermal expansion coefficient between the electrode base material 108 and the ground plate 152 that are members including conductors and the insulating plate 151 made of an insulative material or a dielectric material and connected thereto, so that distortion is caused between these members that are integrally connected. Then, the dimension, such as the length of the through hole extending through the electrode base material 108, the insulating plate 151, and the ground plate 152 is changed, so that the distance between the conductor ring 131 placed on the electrode base material 108 and the terminals on the electric power supply path disposed in the space 150 in the interior of the wafer placing electrode 120 is varied. And, outer force that attempts to deform the electric power supply connector acts on the electric power supply connector connecting these.

In the above technique, when the outer force exceeds the configuring strength of the electric power supply connector, the electric power supply connector is damaged, or even when the magnitude of the distortion caused is within the range in which the electric power supply connector is deformable, the wafer placing electrode 120 is repeatedly distorted due to heating and cooling for each process and expansion therewith in the process for manufacturing the semiconductor device in the plasma etching apparatus that continuously processes a plurality of wafers 109. With this, sliding with the deformation occurs in the interior of the electric power supply connector or in the connection portion with the electric power supply connector and other members, thereby causing wear, reactive product formation due to the interaction, and breakage. As a result, the problem that the reliability of the plasma processing apparatus over a long period is deteriorated arises.

Therefore, in the plasma etching apparatus 100 of this embodiment, the plate spring 135 is disposed in the space 141 in the interior of the insulating boss 144 to be interposed between the upper terminal 143 and the lower terminal 145 below the electric power supply boss 133 and to be biased with respect to the upper terminal 143 and the lower terminal 145 in the direction indicated by the double-headed arrow P in FIG. 2 (up-down direction). With this, the plate spring 135 is deformed to follow the connection location by the expansion or contraction in the up-down direction of the plate spring 135 having resiliency with respect to the position change of the upper terminal 143 and the lower terminal 145 connected by the bolt with the change in the shape of the through hole 120*c* caused by the above distortion, in particular, the change in the length of the electric power supply path in the up-down direction in the through hole 120*c*. And, since the connection location of these is disposed in the space 141 made to be at the atmospheric pressure, the performance of the heat transmission by the plate spring 135 is maintained high, so that the temperature of the conductor ring 131 can be prevented from being excessively increased.

Further, in the plasma etching apparatus 100 of this embodiment, the gap between the members is suitably disposed in the electric power supply path for the high frequency electric power through the electric power supply connector 161 to the conductor ring 131, in particular, in the interior of the wafer placing electrode 120, and the distance in which the high frequency electric current flows is greatly ensured to increase the withstand voltage.

Figure 4:
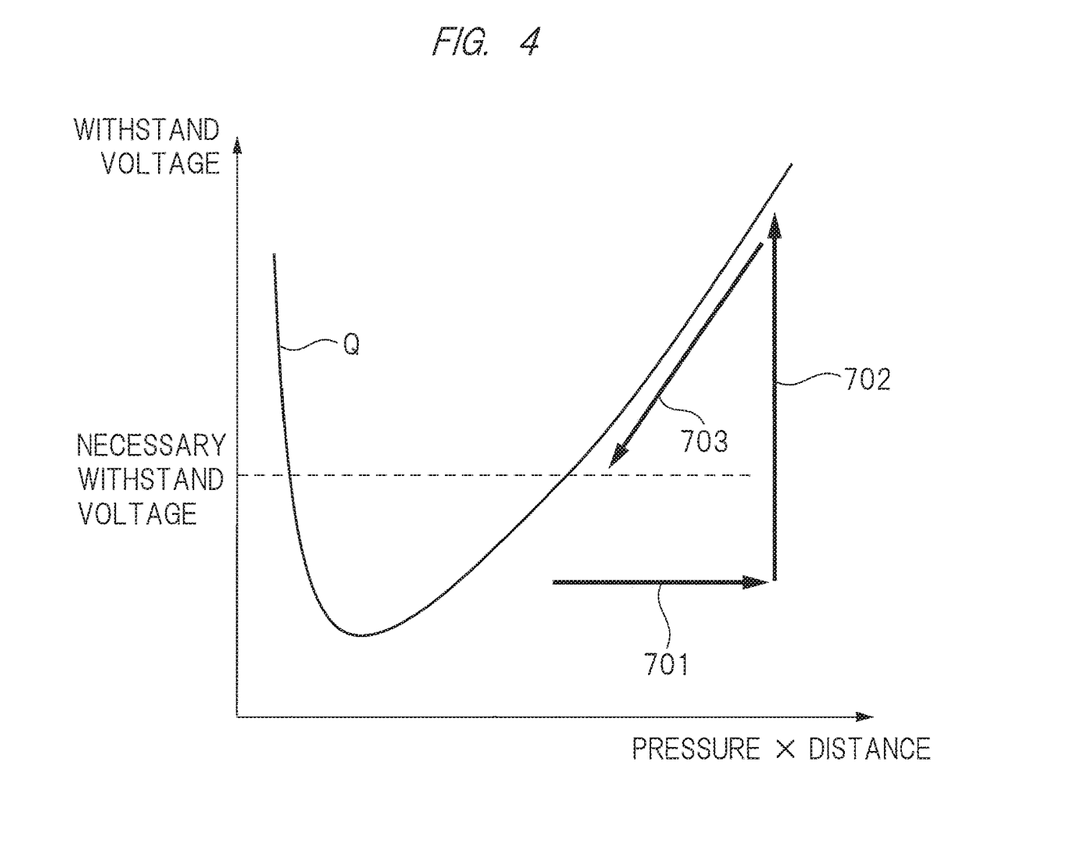
FIG. 4 is a graph schematically illustrating Paschen's law.

Here, FIG. 4 is a graph schematically illustrating Paschen's law. As illustrated in FIG. 4, when the product of the potential difference (voltage) between two members and the shortest distance between the members is taken on the horizontal axis, a solid line Q representing the voltage at which discharge is started is represented as a curve that projects downward. Under the conditions in which the distance between the members belongs to the region on the left side of the curve of the graph very closely, the shortest distance is minimized so that the withstand voltage can be increased. On the contrary, like this embodiment, when the electric power supply connector 161 disposed in the interior of the electrode base material 108 and configuring the electric power supply path in the through hole 120*c* is disposed and is completely electrically separated from the electrode base material 108, the distance between the members belongs to the region on the right side of the curve in FIG. 4. Thus, by increasing the distance in which the electric current is transmitted between the members causing the potential difference, the withstand voltage can be increased.

That is, to increase the withstand voltage, as indicated by an arrow 701, pressure x distance that is the parameter taken on the horizontal axis, that is, the distance or pressure, is required to be increased. For example, the gap between the members is made to be at the atmospheric pressure to increase the withstand voltage, as indicated by an arrow 702, so that the discharge can be effectively prevented. In addition, at the pressure at which the withstand voltage above the value necessary for the specifications is obtained, the size of the gap between the members can be smaller within the range in which the necessary withstand voltage is obtained (arrow 703).

Further, the heat transmission between the electric power supply boss 133, the plate spring 135, the upper terminal 143, the lower terminal 145, and the like in the interior of the space 141 made to be at the atmospheric pressure and the electrode base material 108 through the atmospheric pressure gas is promoted, and the temperature of the electric power supply connector 161 or the conductor ring 131 and the susceptor ring 113 can be prevented from being excessively increased.

In addition, as illustrated in FIG. 2, the plate spring 135 has the dimension in which the plate spring 135 does not come into contact with the inner wall of the insulating boss 144 when the plate spring 135 is expanded and contracted in the up-down direction P. Further, in order that the skin resistance during the passing of the high frequency electric current can be lowered and the area in which the high frequency electric current passes can be wider, the metal plate material having a predetermined width is bent in an accordion shape and in a staggered manner in the length direction (here, the up-down direction P).

And, as the material of the plate spring 135 of this embodiment, for example, austenitic SUS304-CSP is used, and to lower the skin resistance with respect to the high frequency electric current, the surface of the plate material is gold plated. Typical stainless, titanium, aluminum, and copper that can maintain spring properties may be used.

In addition, when the thickness of the plate spring 135 is twice the skin depth with respect to the high frequency electric current having the predetermined frequency, the electric current transmission efficiency can be maximum. Here, in this embodiment in which 400 kHz is used as the frequency of the high frequency electric power, the calculated skin depth for the gold is 0.1 mm. Thus, most preferably, the plate spring 135 is manufactured to have a plate thickness of 0.1 mm×2=0.2 mm. In consideration of the limit of the tolerance and precision for manufacture, approximately 0.1 to 1.0 mm is preferable.

In addition, the susceptor ring 113 including a dielectric of this embodiment includes a plurality of members, and can be divided into at least two. That is, the susceptor ring 113 is divided into an upper susceptor 138 covering the upper face, the inner peripheral wall face, and the outer peripheral wall face of the conductor ring 131 and disposed to cover the recess 120d on the outer peripheral side of the protrusion of the electrode base material 108 and the insulating ring 139 disposed below the inner peripheral side portion of the upper susceptor 138 and on which the conductor ring 131 is placed. The conductor ring 131 is covered on its upper side and its lateral side by the upper susceptor 138 in a state where the conductor ring 131 is placed on the upper side of the upper face of the insulating ring 139, and is thus incorporated inside the susceptor ring 113.

It should be noted that the susceptor ring 113 may be an integrally joined member without being divided into a plurality of members, and the conductor ring 131 may be disposed in the interior of the integral type susceptor ring 113. For example, in a state where the conductor ring 131 is interposed between two quartz members, the diffusion joining and the integral sintering of the quartz members may be used.

Figure 5:
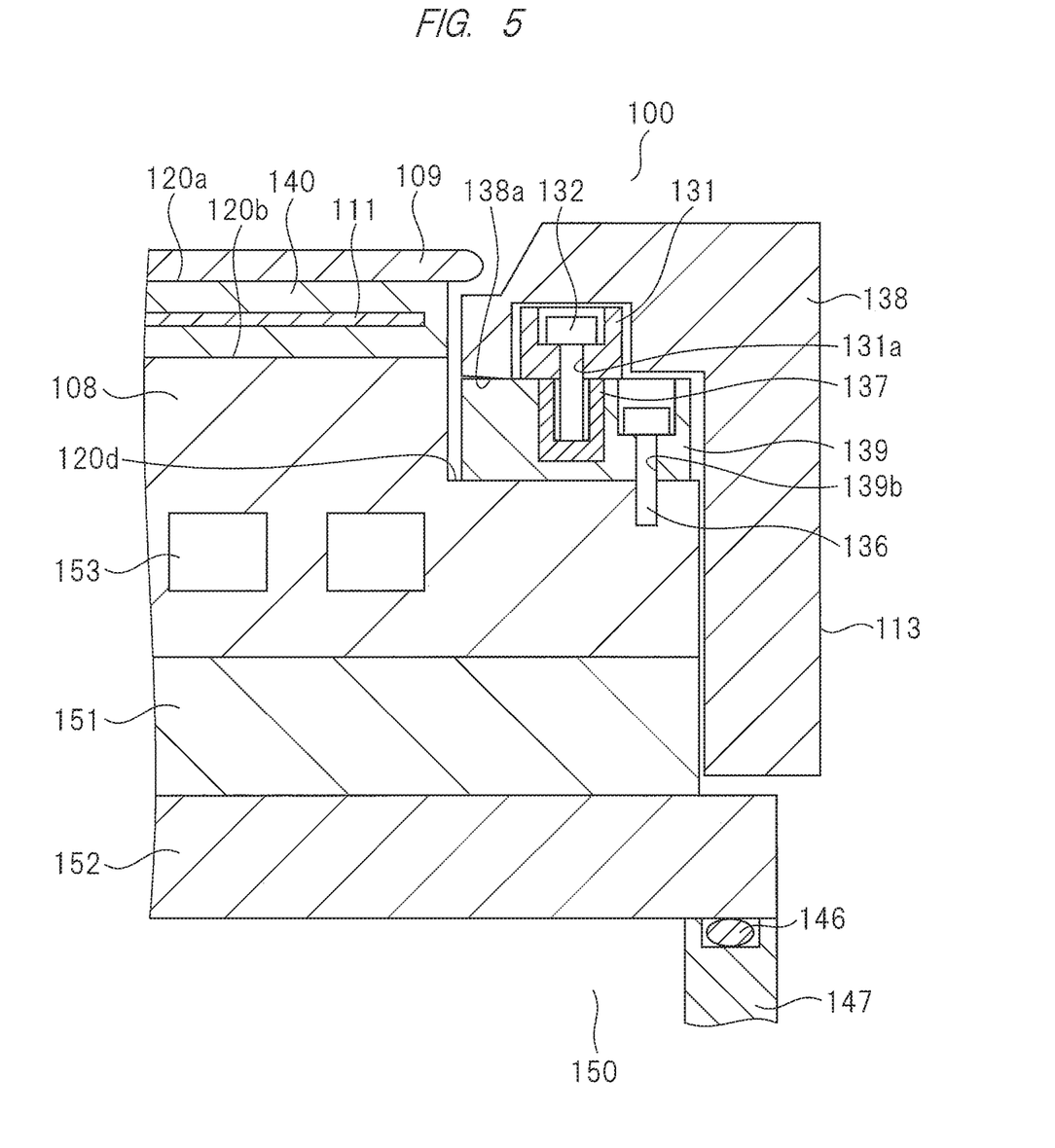
FIG. 5 is a schematic cross-sectional view illustrating, in enlarged dimension, the configuration of another susceptor ring portion of the sample stage illustrated in FIG. 2.

Next, FIG. 5 is a schematic cross-sectional view illustrating, in enlarged dimension, the configuration of another susceptor ring portion of the sample stage illustrated in FIG. 2.

In the configuration illustrated in FIG. 5, to place the insulating ring 139 on the recess 120d in the outer peripheral side portion of the upper portion of the electrode base material 108 to fix the position of the insulating ring 139, the insulating ring 139 is fastened to the electrode base material 108 by an insulative screw 136 inserted into a through hole 139b disposed on the outer peripheral side of the location at which the conductor ring 131 is placed.

Further, to fasten the conductor ring 131 placed on the insulating ring 139 to the insulating ring 139 to fix the position of the conductor ring 131, a plurality of heliserts 137 having female threads inside a plurality of holes disposed in the ring-shaped upper face of the insulating ring 139 are inserted, and are then bonded and fixed to the insulating ring 139. A plurality of through holes 131a of the conductor ring 131 placed to cover the plurality of heliserts 137 and the heliserts 137 are matched in position to insert a plurality of conductive screws 132 into the through holes 131a, so that the conductor ring 131 is fastened to the insulating ring 139.

In this embodiment, three or more heliserts 137 are disposed at three locations or more in the peripheral direction of the insulating ring 139, and fasten the conductor ring 131 having poor flatness at the three locations or more. With this, the insulating ring 139 and the upper susceptor 138 are disposed to surround the upper and lower portions and the outer periphery of the conductor ring 131. The conductor ring 131 is coupled to the insulating ring 139 at the locations of the plurality of heliserts 137, so that the flatness in the peripheral direction of the upper face of the conductor ring 131 can be improved, which can prevent the variation in the height of the upper face of the conductor ring 131 affecting the electric potential distribution in the space above the wafer 109 being processed. As a result, the characteristic and result of the processing on the upper face of the outer peripheral side portion of the wafer 109 can be close to the peripheral direction more uniformly.

In addition, on the bottom face of the inner peripheral side portion of the upper susceptor 138, an abutting face 138a coming into contact with and abutting on the inner peripheral side portion of the upper face of the insulating ring 139 in a state where the upper susceptor 138 incorporates the conductor ring 131 and is placed on the insulating ring 139 is formed in a ring shape at the position on the inner peripheral side of the conductor ring 131. The abutting face 138a of the upper susceptor 138 onto the insulating ring 139 is formed to reduce the interaction of the surface of the conductor ring 131 with the particles in the plasma 116 having high reactivity, so that any reactive products from the outer peripheral edge of the wafer 109 and the interior of the plasma 116 can be prevented from adhering to the surface of the conductor ring 131.

According to the above embodiment, the electric power supply connector 161 is provided on the electric power supply path for the high frequency electric power connected to the conductor ring 131, so that the impedance of the electric power supply path for the high frequency electric power to the conductor ring 131 disposed in the interior of the susceptor ring 113 and to which the high frequency electric power is supplied can be lowered, and further, the electric power supply path, in particular, the electric power supply connector 161 in the interior of the electrode base material 108, can be efficiently cooled. Further, the deformation and sliding due to the heat generation in the electric power supply connector 161 and the failure and consumption progress due to this can be reduced, so that the reliability and yield of the plasma etching apparatus 100 can be maintained high over a long period.

In addition, the plate spring 135 is provided as the configuring member of the electric power supply connector 161, so that the heat release area of the electric power supply path for applying the high frequency to the periphery of the wafer 109 can be wider, and the impedance of the electric power supply path can be reduced. Further, the high frequency is propagated efficiently to the edge of the wafer 109, so that the heat generation in the electric power supply path can be prevented. With this, the reliability of the plasma processing apparatus can be improved, and the yield of the plasma processing can be improved.

First Modification

Figure 6:
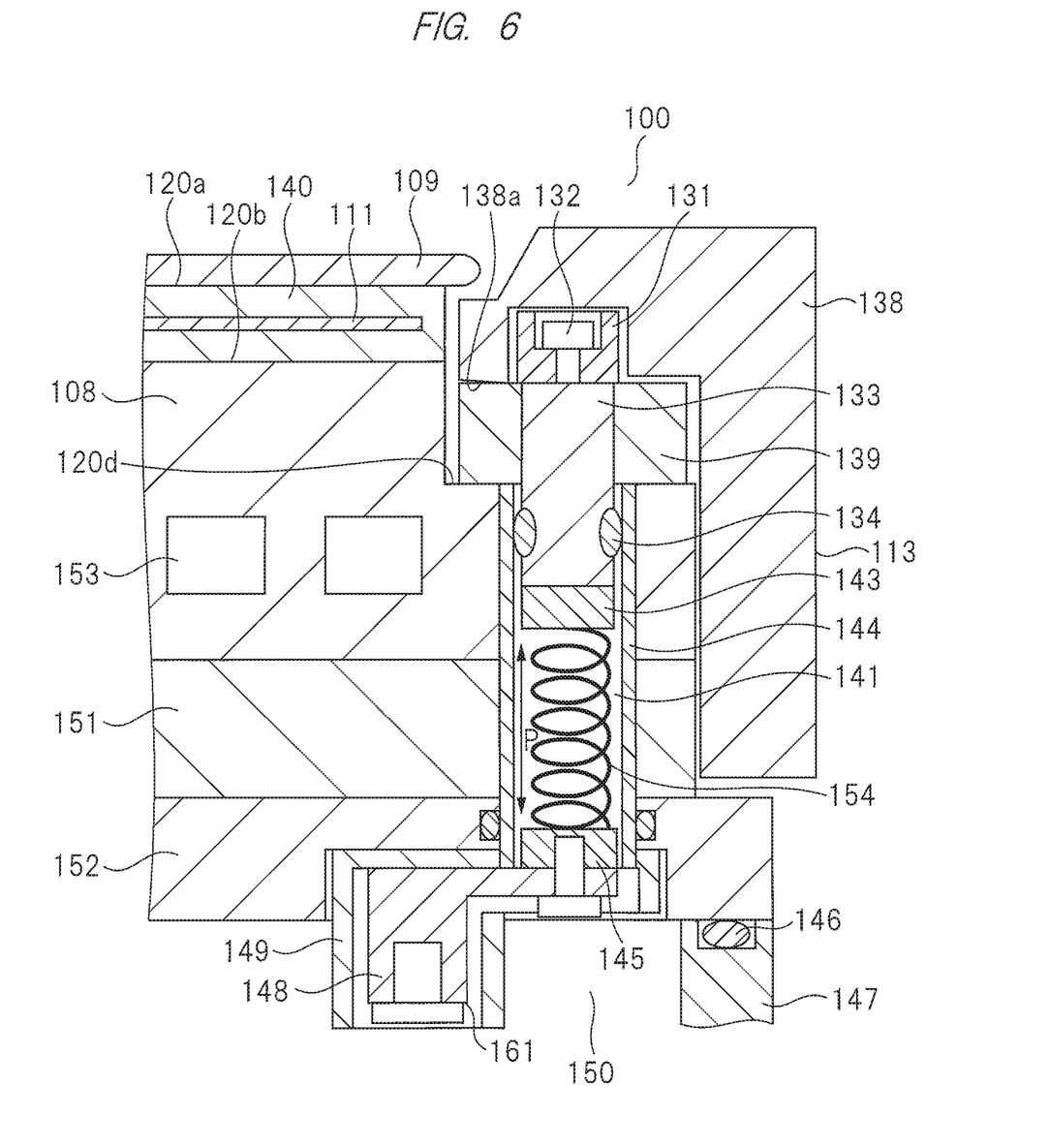
FIG. 6 is a schematic cross-sectional view illustrating, in enlarged dimension, the configuration of a susceptor ring portion of the sample stage of the plasma processing apparatus according to a first modification of the embodiment of the present invention.

A first modification of this embodiment will be described with reference to FIG. 6. FIG. 6 is a schematic cross-sectional view illustrating, in enlarged dimension, the configuration of a susceptor ring portion of the sample stage of the plasma processing apparatus according to the first modification of the embodiment of the present invention.

In place of the plate spring 135 of the electric power supply connector 161 having the configuration in FIG. 2, the plasma etching apparatus 100 of the first modification includes a coil spring (spring member, conductive member) 154 including a conductive member, such as metal, and wound in a plurality of stages about the axis in the up-down direction P to have resiliency. The plasma etching apparatus 100 of the first modification includes the same configuration as the plasma etching apparatus 100 in FIG. 2 except for the coil spring 154. As the material of the coil spring 154, for example, austenitic SUS304-CSP is used, and to lower the skin resistance with respect to the high frequency electric power, the surface of the coil spring 154 is gold plated. The material of the coil spring 154 may be typical stainless, titanium, aluminum, and copper.

In the plasma etching apparatus 100 in FIG. 6, 400 kHz is used as the frequency of the high frequency electric power, so that the skin depth for the gold with respect to this frequency is 0.1 mm. From this, the coil spring 154 preferably includes a wire-like member having a diameter of 0.1 mm×2=0.2 mm or more. In consideration of the tolerance and precision for manufacture, a member having a wire diameter of 0.2 to 3.0 mm is preferably used.

Second Modification

Figure 7:
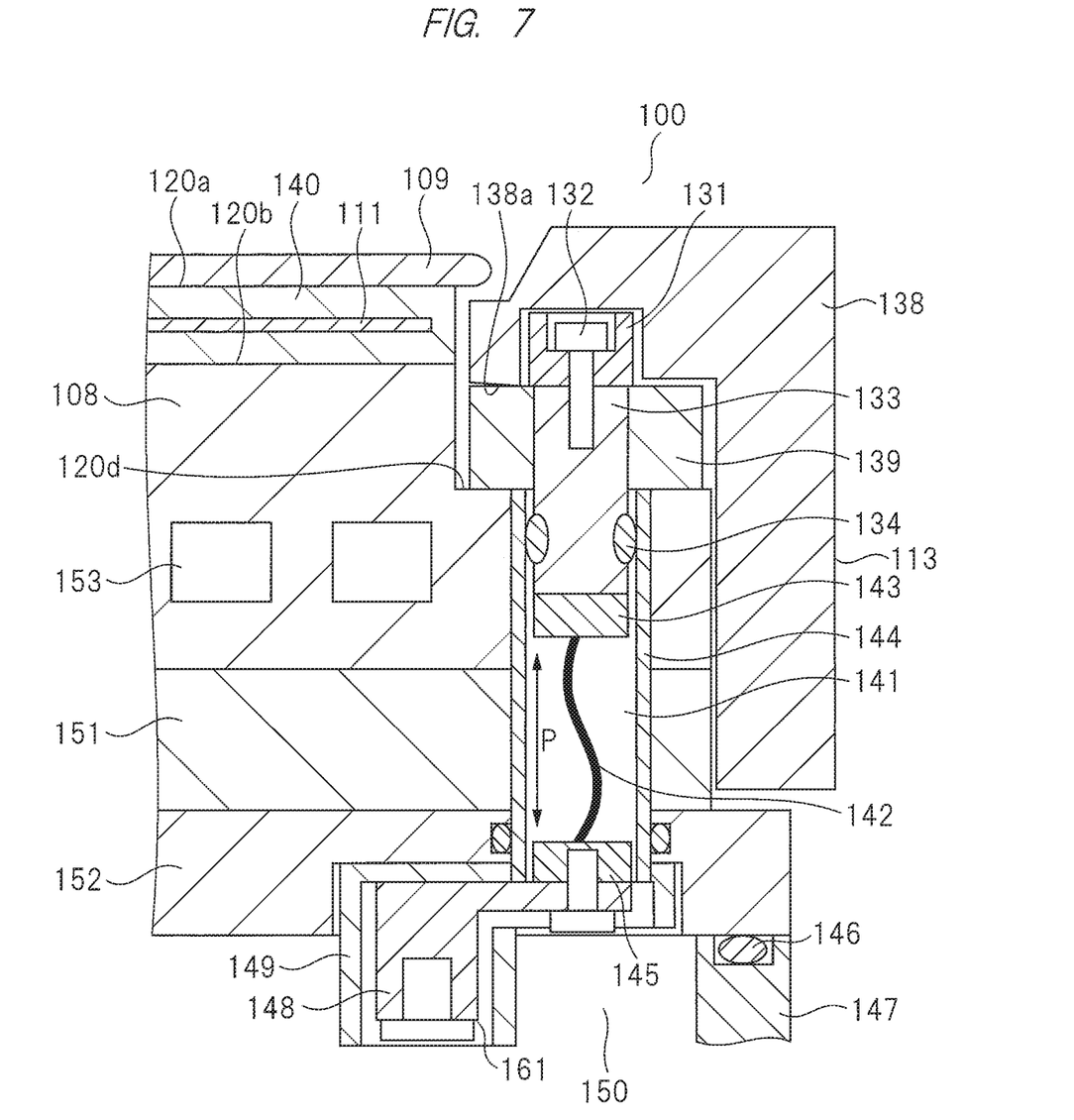
FIG. 7 is a schematic cross-sectional view illustrating, in enlarged dimension, the configuration of a susceptor ring portion of the sample stage of the plasma processing apparatus according to a second modification of the embodiment of the present invention.

Another modification (second modification) of the first modification will be described with reference to FIGS. 7 and 8. FIG. 7 is a schematic cross-sectional view illustrating, in enlarged dimension, the configuration of a susceptor ring portion of the sample stage of the plasma processing apparatus according to the second modification of the embodiment of the present invention, and FIG. 8 is a schematic perspective view illustrating, in enlarged dimension, the configuration of a curved plate spring illustrated in FIG. 7.

Figure 8:
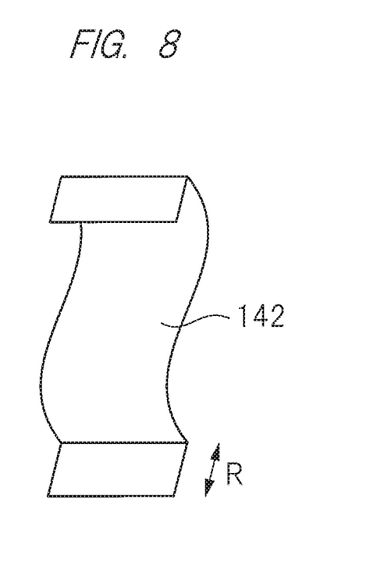
FIG. 8 is a schematic perspective view illustrating, in enlarged dimension, the configuration of a curved plate spring illustrated in FIG. 7.

In place of the plate spring 135 of the electric power supply connector 161 having the configuration in FIG. 2, the plasma etching apparatus 100 of the second modification includes a curved plate spring 142 including a plate member including a conductive member, such as metal, and having unevenness in a left-right direction R indicated in FIG. 8. The plasma etching apparatus 100 of the second modification includes the same configuration as the plasma etching apparatus 100 in FIG. 2 except for the curved plate spring 142. As the material of the curved plate spring 142, for example, austenitic SUS304-CSP is used, and to lower the skin resistance with respect to the high frequency electric power, the surface of the curved plate spring 142 is gold plated. The material of the curved plate spring 142 may be typical stainless, titanium, aluminum, and copper.

In the plasma etching apparatus 100 in FIG. 7, most efficiently, the thickness of the curved plate spring 142 is twice the skin depth. In the second modification, 400 kHz is used as the frequency of the high frequency electric power, so that the skin depth for the gold with respect to this frequency is 0.1 mm. Thus, the thickness of the curved plate spring 142 is preferably 0.1 mm×2=0.2 mm or more. In consideration of the tolerance and precision for manufacture, the plate thickness of the curved plate spring 142 is preferably approximately 0.1 to 1.0 mm.

Third Modification

Figure 9:
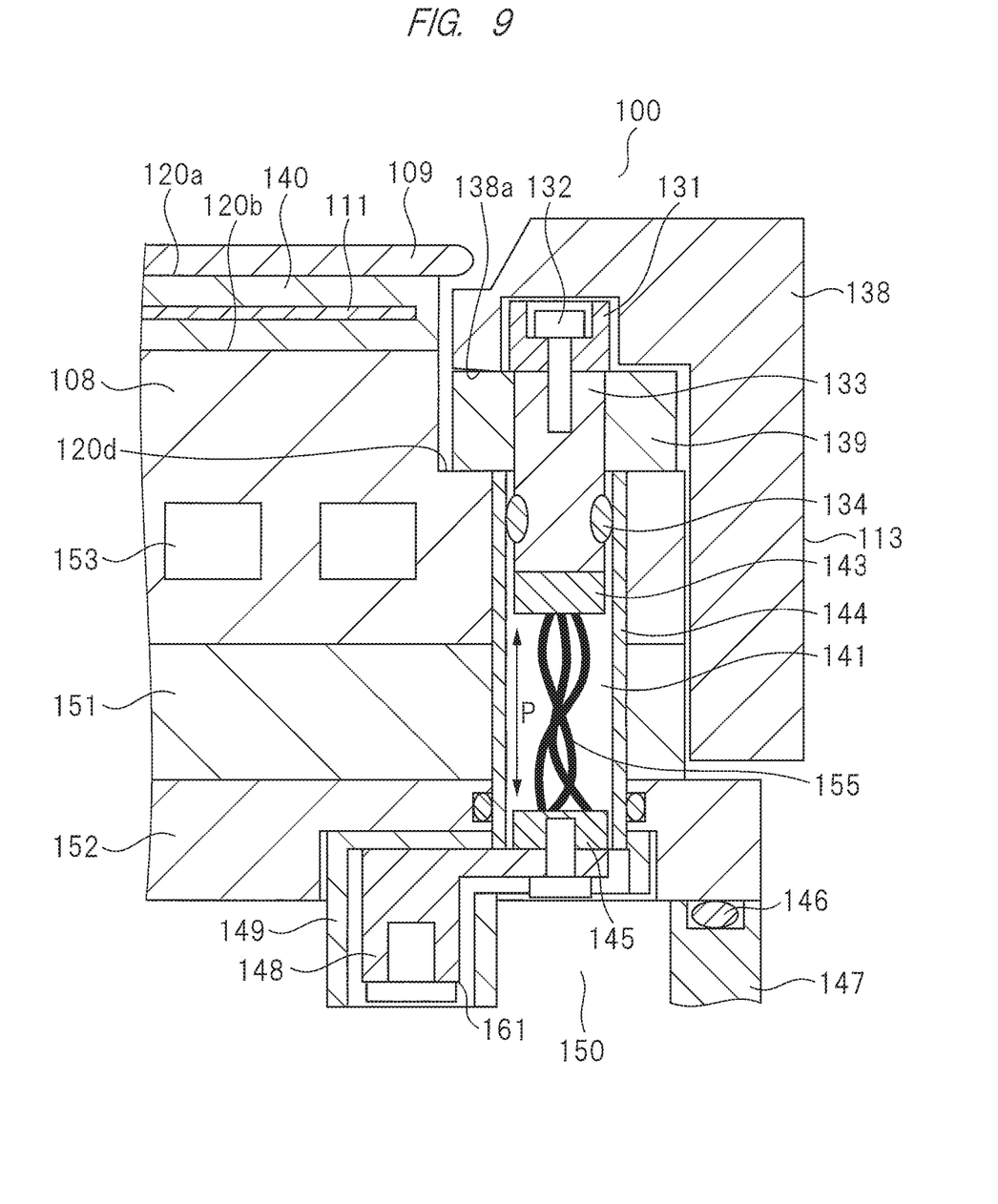
FIG. 9 is a schematic cross-sectional view illustrating, in enlarged dimension, the configuration of a susceptor ring portion of the sample stage of the plasma processing apparatus according to a third modification of the embodiment of the present invention.

A further modification (third modification) of the above embodiment will be described with reference to FIG. 9. FIG. 9 is a schematic cross-sectional view illustrating, in enlarged dimension, the configuration of a susceptor ring portion of the sample stage of the plasma processing apparatus according to the third modification of the embodiment of the present invention.

In place of the plate spring 135 of the electric power supply connector 161 having the configuration in FIG. 2, the plasma etching apparatus 100 of the third modification includes stranded wires (conductive members) 155 formed by stranding a plurality of conductive wires that are conductive members, such as metal (for example, electric power supply wires). The plasma etching apparatus 100 of the third modification includes the same configuration as the plasma etching apparatus 100 in FIG. 2 except for the stranded wires 155. In the third modification, as the material of the stranded wires 155, for example, austenitic SUS304-CSP is used, and to lower the skin resistance with respect to the high frequency electric power, the surface of each of the conductive wires is tin plated. The material of the stranded wires 155 may be typical stainless, titanium, aluminum, and copper.

In the plasma etching apparatus 100 in FIG. 9, most efficiently, the wire diameter of the collected stranded wires 155 is twice the skin depth. In the third modification, 400 kHz is used as the frequency of the high frequency electric power, so that the skin depth for the tin with respect to this frequency is 0.3 mm. Thus, the collection diameter of the stranded wires 155 is preferably 0.3 mm×2=0.6 mm or more. In consideration of the tolerance and precision for manufacture, the collection diameter of the stranded wires 155 is preferably approximately 0.6 to 10 mm. It should be noted that the collection diameter of the stranded wires 155 represents the diameter at the location where the diameter of the collected stranded wires 155 is maximum.

Next, in the above embodiment or the first to third modifications, the material to be etched of the film layer to be processed included in the film structure previously disposed on the upper face of the wafer 109 before the processing is a silicon oxide film, and in this case, as the etching processing gas and cleaning gas for cleaning, tetrafluoromethane gas, oxygen gas, and trifluoromethane gas are used. In addition, as the material to be etched, not only the silicon oxide film, but also a polysilicon film, a photoresist film, an antireflective organic film, an antireflective inorganic film, an organic material, an inorganic material, a silicon oxide film, a silicon nitride and oxide film, a silicon nitride film, a Low-k material, a High-k material, an amorphous carbon film, an Si substrate, a metal material, and the like can be used, and also in these cases, the same effect can be obtained.

In addition, as the etching processing gas, chlorine gas, hydrogen bromide gas, tetrafluoromethane gas, trifluoromethane gas, difluoromethane gas, argon gas, helium gas, oxygen gas, nitrogen gas, carbon dioxide gas, carbon monoxide gas, hydrogen gas, and the like can be used. Further, as the etching processing gas, ammonia gas, octafluoropropane gas, trifluoronitrogen gas, hexafluorosulfur gas, methane gas, tetrafluorosilicon gas, silicon tetrachloride gas, neon gas, krypton gas, xenon gas, radon gas, and the like can be used.

The inventions made by the present inventors have been specifically described above based on the above embodiment, but the present invention is not limited to the above embodiment, and includes various modifications. For example, the above embodiment has been described in detail to simply describe the present invention, and does not necessarily include all the described configurations.

In addition, part of the configuration of one embodiment can be replaced with the configurations of other embodiments, and the configuration of one embodiment can be added with the configurations of other embodiments. Further, part of the configuration of each of the embodiments can be subjected to addition, deletion, and replacement with respect to other configurations. It should be noted that each member and the relative sizes illustrated in the drawings are simplified and idealized to simply describe the present invention, and thus, the mounting configuration is more complicated.

In the above embodiment, the configuration in which the microwave electric field having the frequency of 2.45 GHz and the magnetic field that can form ECR with the microwave electric field are supplied into the processing chamber 104, and the processing gas is then discharged to form the plasma has been described. However, even when the configuration described in the above embodiment forms the plasma by using other discharge (UHF discharge with magnetic field, capacitively coupled discharge, inductively coupled discharge, magnetron discharge, surface wave excited discharge, transfer coupled discharge), the same operation and effect as described in the above embodiment and the like can be provided. In addition, the same operation and effect can be obtained in the case of applying the above embodiment and the first to third modifications to the wafer placing electrode disposed in other plasma processing apparatuses for performing the plasma processing, for example, a plasma CVD apparatus, an asking apparatus, a surface modifying apparatus, and the like.

LIST OF REFERENCE SIGNS

100 Plasma etching apparatus (plasma processing apparatus)
101 Vacuum vessel
102 Shower plate
102*a* Gas admission hole
103 Dielectric window
104 Processing chamber
105 Waveguide
106 Electric field generating power source
107 Magnetic field generating coil
108 Electrode base material
109 Semiconductor wafer
110 Vacuum exhaust port
111 Conductor film (electrostatic suctioning electrode)
112 Ground
113 Susceptor ring (ring-shaped member)
116 Plasma
120 Wafer placing electrode (sample stage, first electrode)
120*a* Placing face
120*b* Upper face
120*c* Through hole
120*d* Recess
124 High frequency power source (first high frequency power source)
125 High frequency filter
126 Direct current power source
127 High frequency power source (second high frequency power source)
128, 129 Matching device
130 Load impedance variable box
131 Conductor ring (second electrode)
131*a* Through hole
132 Conductive screw
133 Electric power supply boss
134 O-ring
135 Plate spring (spring member, conductive member)
136 Insulative screw
137 Helisert
138 Upper susceptor
138*a* Abutting face
139 Insulating ring
139*a*, 139*b* Through hole
140 Dielectric film
141 Space
142 Curved plate spring
143 Upper terminal (Terminal at an upper end)
144 Insulating boss (tubular member)
145 Lower terminal (Terminal at a lower end)
146 Seal member
147 Electrode base
148 Relay terminal
149 Guiding section
150 Space
151 Insulating plate
152 Ground plate
153 Coolant flow passage
154 Coil spring (spring member, conductive member)
155 Stranded wire (conductive member)
160 Electric field and magnetic field forming section
161 Electric power supply connector
701, 702, 703 Arrow

The invention claimed is:

1. A plasma processing apparatus for processing a semiconductor wafer using plasma in a processing chamber, comprising:
a vacuum vessel including, in the interior of the vacuum vessel, the processing chamber in which the plasma is generated;
a sample stage disposed in the lower portion of the processing chamber and including a placing face on which a semiconductor wafer to be processed is placed, the sample stage being supplied first high frequency electric power from a high frequency power source while the plasma is generated;

a power source configured to form an electric field for plasma generation by using gas supplied into the processing chamber;

a base material constituted by a conductive material and an insulating plate disposed below the base material both of which have cylindrical shapes and configure the sample stage;

a ring-shaped member constituted by a dielectric material and disposed above the base material in the outer periphery of the placing face of the sample stage to cover the surface of the outer periphery of the sample stage;

a ring-shaped electrode which is disposed between the ring-shaped member and the base material, and to which second high frequency electric power is supplied; and an electric power supply connector being disposed in a through hole arranged inside the sample stage including at least the base material and the insulating plate below the ring-shaped electrode, and configuring a path for supplying the second high frequency electric power to the ring-shaped electrode, wherein the electric power supply connector includes a portion disposed in the interior of a tubular insulating member, the tubular insulating member being constituted by an insulative material and disposed in the through hole, the portion extending from an upper end portion of the through hole toward a lower space of a bottom surface of the sample stage through a bottom end opening of the through hole on the bottom surface of the sample stage wherein in the through hole an atmospheric pressure is maintained, and the portion including a cylindrical upper end member a position of which is fixed with respect to the base material inside the tubular insulating member, a lower end member which extends from the inside space of the through hole to the lower space of the sample stage, and a resilient conductor which is disposed between the cylindrical upper end member and the lower end member and is electrically connected with both and is biased in an up-down direction, and is expanded and contracted, the portion being configured to increase and decrease a length between the cylindrical upper end member and the lower end member through the bottom end opening by the resilient conductor's expansion and contraction, wherein the apparatus further comprises a seal member disposed between an outer cylindrical side wall surface of the cylindrical upper end member and an inner cylindrical side wall surface of the tubular insulating member and hermetically sealing an upper region of an interior space of the insulative tubular member from a lower region of said interior space of the insulative tubular member, said lower region communicates with the lower space of the sample stage that is maintained in the atmospheric pressure.

2. The plasma processing apparatus according to claim 1, wherein the resilient conductor is a spring.

3. The plasma processing apparatus according to claim 2, wherein the spring is a plate spring.

4. The plasma processing apparatus according to claim 3, wherein the thickness of the plate spring is 0.1 to 1.0 mm.

5. The plasma processing apparatus according to claim 1, wherein the resilient conductor is a coil spring.

6. The plasma processing apparatus according to claim 5, wherein the wire diameter of the coil spring is 0.2 to 3.0 mm.

7. The plasma processing apparatus according to claim 1, wherein the resilient conductor includes stranded wires including a plurality of stranded electric power supply wires.

8. The plasma processing apparatus according to claim 7, wherein the collection diameter of the stranded wires is 0.6 to 10 mm.

* * * * *